(12) United States Patent
Deliwala et al.

(10) Patent No.: US 8,538,215 B2
(45) Date of Patent: Sep. 17, 2013

(54) OPTICAL PACKAGE AND RELATED METHODS

(75) Inventors: Shrenik Deliwala, Andover, MA (US); Dipak Sengupta, Boxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 491 days.

(21) Appl. No.: 12/784,184

(22) Filed: May 20, 2010

(65) Prior Publication Data
US 2011/0286690 A1 Nov. 24, 2011

(51) Int. Cl.
G02B 6/26 (2006.01)
G02B 6/36 (2006.01)

(52) U.S. Cl.
USPC .............................................. 385/52; 385/90

(58) Field of Classification Search
None
See application file for complete search history.

(56) References Cited

U.S. PATENT DOCUMENTS

| | | | |
|---|---|---|---|
| 5,247,597 A | 9/1993 | Blacha et al. | |
| 6,869,231 B2 * | 3/2005 | Chiu et al. | 385/93 |
| 7,720,337 B2 * | 5/2010 | Lu et al. | 385/52 |
| 7,807,505 B2 | 10/2010 | Farnworth et al. | |
| 2002/0021874 A1 * | 2/2002 | Giboney et al. | 385/90 |
| 2006/0045421 A1 * | 3/2006 | Baets et al. | 385/33 |
| 2009/0014857 A1 | 1/2009 | Hufgard | |
| 2009/0070727 A1 | 3/2009 | Solomon | |
| 2009/0213262 A1 | 8/2009 | Singh et al. | |
| 2009/0269006 A1 * | 10/2009 | Ishikawa et al. | 385/25 |
| 2010/0019393 A1 | 1/2010 | Hsieh et al. | |
| 2010/0187557 A1 | 7/2010 | Samoilov et al. | |
| 2010/0200998 A1 | 8/2010 | Furuta et al. | |
| 2010/0244217 A1 | 9/2010 | Ha et al. | |
| 2011/0062572 A1 | 3/2011 | Steijer et al. | |
| 2012/0027234 A1 | 2/2012 | Goida | |

OTHER PUBLICATIONS

U.S. Appl. No. 13/411,375, filed May 2, 2012, and its ongoing prosecution history, including without limitation Office Actions, Amendments, Remarks, and any other potentially relevant documents, Doscher et al.
U.S. Appl. No. 13/462,604, filed May 2, 2012, and its ongoing prosecution history, including without limitation Office Actions, Amendments, Remarks, and any other potentially relevant documents, Sengupta.
U.S. Appl. No. 13/560,855, filed Jul. 7, 2012, and its ongoing prosecution history, including without limitation Office Actions, Amendments, Remarks, and any other potentially relevant documents, Goida.

* cited by examiner

*Primary Examiner* — Tina Wong
(74) *Attorney, Agent, or Firm* — Knobbe Martens Olson & Bear LLP (57) ABSTRACT

A package for an electronic chip including an optical component protects the chip and the component, while allowing for an optical connection of the component with another optical device. This is achieved, in various embodiments, by forming a well in a protective material deposited over the chip to expose the optical component, and by providing alignment features in the protective material to align and connect the optical component with another optical device.

28 Claims, 7 Drawing Sheets

OPTICAL PACKAGE AND RELATED METHODS

TECHNICAL FIELD

The present invention relates to packages for electronic chips, and more particularly to fabrication of a package for a chip including an optical component, such as an emitter or receiver.

BACKGROUND

When optoelectronic devices such as an optical fiber and an optical emitter or receiver are to be connected to each other, the devices must be precisely aligned in order for the overall assembly to operate properly. For example, the optical axis of an emitter, such as a semiconductor laser, must be precisely aligned with that of the optical fiber, so that a laser beam emitted from the semiconductor laser enters the optical fiber properly.

Two methods of aligning optical devices are well known in the art. In "active alignment," one optical device (typically the emitter) is turned on during the alignment process. The light beam emanating from the emitter passes through the fiber and is detected by a photodetector at the other end of the fiber. Relative movement between the emitter and the optical fiber is imparted until the photodetector detects a high or maximum light intensity, which indicates a desirable alignment. This trial-and-error method of active alignment is time-consuming and results in high fabrication costs.

In "passive alignment," specific locations for each device on a substrate are set by micromachining while manufacturing the devices, and the devices to be optically connected are affixed thereto. Passive alignment can also be expensive because a manufacturer must tightly control the micromachining process so that each device is affixed in its exact location. A further problem with both active and passive alignment techniques is that once a desired alignment or a specific alignment location is determined, the two optical devices become permanently connected to one another.

As the data rates of computing backplanes (and consumer products such as video and mobile devices connecting to the backplanes) continue to increase, optical interconnections are expected to be preferred over copper lines. Therefore, there is a need for a low-cost, flexible optical interconnection package.

SUMMARY

A passively aligned optical package according to the present invention can be inexpensive and flexible. This is generally achieved by covering with a protective material a circuit which includes an already-mounted optical component, and then removing a portion of the protective material above the optical component. Another optical device, such as an optical fiber, can be received through the window in the protective material formed by the removal. The wall(s) of the window, as well as the remaining unremoved portion of the protective material, can provide support to the optical device.

In the prior art, achieving precise alignment between an optical device received through the window in the protective material and the optical component in the circuit has involved aligning the center of the window with the center of the optical component. The formation of a window at a precise location, and without damage to the optical component, can be both difficult to achieve and expensive.

According to the present invention, however, the window need not be precisely aligned over the optical component. Instead, alignment of the optical devices is facilitated by forming alignment features (such as holes, pins, or other matable structures) in the protective material. The optical device (or a structure, such as a lid, to which it is coupled, the term "optical device" herein connoting the device itself or the larger structure of which it is a part) to be connected to the optical component in the circuit includes alignment features complementary to and matable with the alignment features (e.g., pins that may be received within alignment holes). This can result in positioning the optical device precisely over the optical component on the circuit—regardless of whether the window itself is precisely aligned with the optical device. Also, it is unnecessary for the optical component to reside precisely within the center of the window. The present invention also provides flexibility because optical structures can be interchanged over the circuit, as long as each structure or device also has features complementary to and matable with the alignment features.

Accordingly, in a first aspect, embodiments of the invention feature a method of fabricating a device that includes a circuit comprising an optical component and a protective material over the circuit and the optical component. In various embodiments, the fabrication method includes removing a portion of the protective material so as to form a window above the optical component. Then, the optical component may be exposed through the window. The method also includes forming alignment features in the protective material. The alignment features are based on a location of the optical component on the circuit, and are formed at locations relative to the optical component.

In some embodiments, the protective material over the circuit and the optical component is opaque, and the alignment features are holes. A laser can be used to remove the protective material above the optical component so as to form a window over the optical component. The laser may also be used to form the alignment features. The alignment features may be formed substantially simultaneously with the step of removing the protective material above the optical component. Alternatively, the locations of the alignment features may be determined, and the alignment features can be formed after removing the protective material above the optical component.

In some embodiments, a passivation layer separates the optical component from the protective material. A laser used for removing the protective material removes such material until the passivation layer is reached. The area of the window from where the protective material is removed can exceeds the area of the optical component. Then, notwithstanding the offset of the laser relative to the optical component, the optical component can be fully exposed through the window.

In some embodiments, an optical device is received through an area from which the protective material is removed. The optical device can be optically connected to the optical component. Alternatively, the optical device can be positioned over the circuit. The optical device may have complementary alignment features that can be mated with the alignment features in the protective material over the circuit and the optical component. The optical device can then be optically connected to the optical component.

In a second aspect, various embodiments of the present invention feature a package configured to receive an aligned optical device. The package includes an optical component disposed on a substrate. The package also includes a protective material over the substrate but the protective material has a window exposing the optical component. The protective material also has alignment features at locations spaced apart from the optical component. The alignment features are configured to receive complementary features of an optical device. The package may include a passivation layer disposed over the substrate but below the protective material. The package may also include electrical pins at the top of the package for electrical connection.

In a third aspect, various embodiments of the present invention feature an optical system including an optical component disposed on a substrate, and a protective material over the substrate but having a window exposing the optical component. The optical system has first alignment features in the protective material at locations spaced apart from the optical component. The optical system also includes an optical device including secondary alignment features complementary to the first alignment features. The secondary alignment features are mated with the first alignment features, thereby aligning the optical device with the optical component. The optical system may include a passivation layer disposed over the substrate but below the protective material.

The optical device of the optical system may include an optical fiber. The optical fiber can directly connect to the optical component through the window in the protective material. The window in the protective material in the optical system may be at least partially filled with an index-matching fluid to reduce scattering of light at the connection between an optical fiber and the optical device.

In some embodiments, the optical device includes a prism and an optical fiber that connects to the optical component through the prism. In some embodiments, the optical device of the optical system includes a lens.

BRIEF DESCRIPTION OF THE DRAWINGS

The invention and various embodiments and features may be better understood by reference to the following drawings in which.

DETAILED DESCRIPTION

Figure 1:
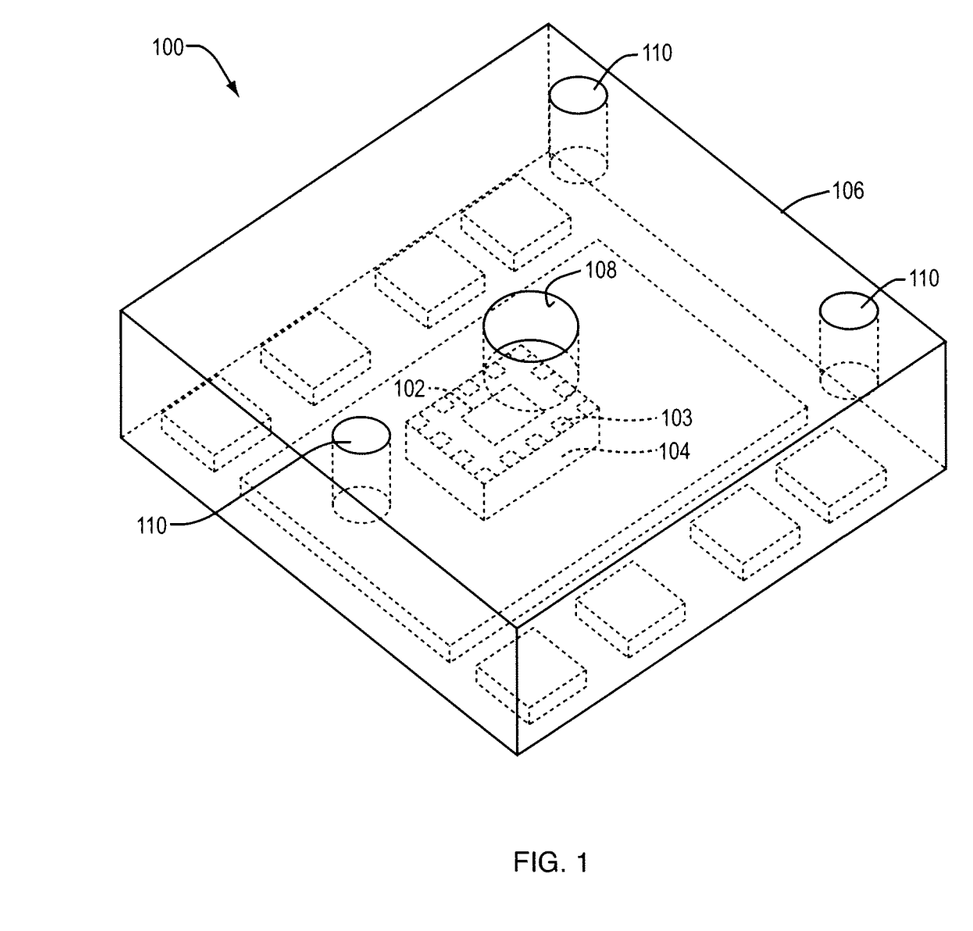
FIG. 1 shows an exemplary optical package to which the approach of the present invention may be applied.

In the exemplary package 100 shown in FIG. 1, an optical component 102 is placed on a substrate 103 of an optoelectronic chip 104. A protective material (e.g. clear plastic material, black epoxy material, or material of a different color) 106 covers both the optoelectronic chip 104 and the optical component 102. A black epoxy material typically provides mechanical rigidity and strong adhesion with the chip, and resists moisture. A window 108 is formed in the protective material 106 by removing (as described below) a portion thereof, to expose the optical component 102. An optical device such as an optical cable (not shown) can be received in window 108 so as to form an optical connection with the optical component 102. In this embodiment, alignment features are illustrated by alignment holes 110.

Typically, an ultra-violet (UV) laser (e.g., a 248 nm KrF laser) is used to remove the protective material 106. Each pulse of the laser can ablate a small amount of the protective material 106. The amount of material ablated in each pulse is determined by the inherent characteristics of the material and the laser. Thus, the number of pulses required to remove substantially all of the material 106 over a selected region (to form the window 108) is straightforwardly determined. The region of the protective material 106 where laser pulses are to be applied can be selected by estimating or observing the location of the optical component 102 in chip 104. It should be understood that ablation by a laser is described only for illustrative purposes, and that other techniques of removing material, such as mechanical drilling, are also within the scope of the present invention.

Figure 2:
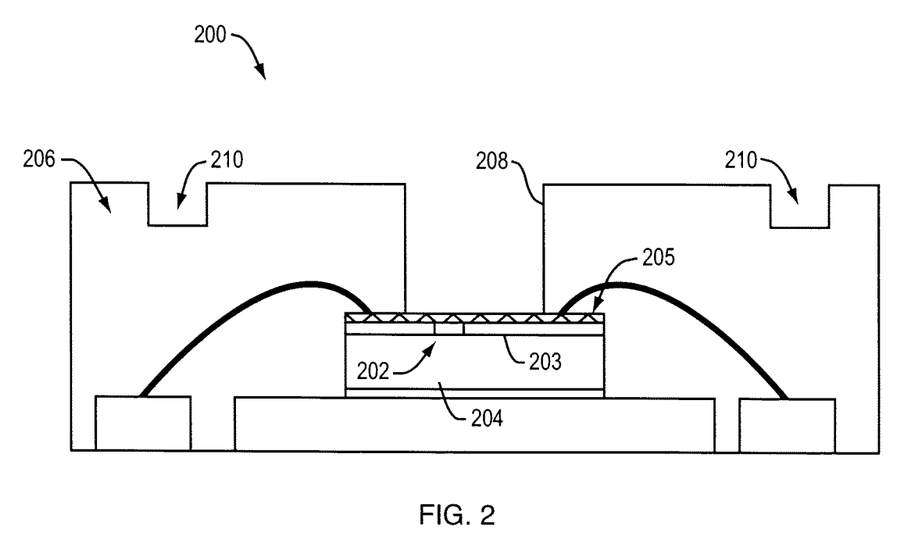
FIG. 2 shows a cross-sectional view of another optical package to which the approach of the present invention may be applied.

FIG. 2 shows a cross-sectional view of another package to which the approach of the present invention may be applied. An optical component 202 is placed on a substrate 203 of an optoelectronic chip 204. A passivation layer 205 covers both the optoelectronic chip 204 and the optical component 202. Passivation layer 205 can be formed by depositing a transparent material over the optoelectronic chip and the optical component. Additionally, the material can be absorptive to a UV laser used for ablating the protective material. Examples of materials suitable to form a passivation layer include polyamides used in the integrated circuit (IC) manufacturing industry or polymer compounds such as photoresists.

A protective material 206, placed over the passivation layer 205, covers both the optoelectronic chip 204 and the optical component 202. A window 208 is formed in the protective material 206 by removing a portion thereof, to expose the optical component 202. While forming the window 208 by removing a portion of the protective material 206, a portion of the passivation layer 205 may also be removed, but at least some portion of the passivation layer 205 is preserved over the optical component 202, as described below. FIG. 2 shows that the optical component 202 is fully exposed by the window 208, but the optical component 202 is not aligned with the center of window 208. Finally, by the way of example, alignment features are shown as alignment holes 210 in FIG. 2.

An operator typically stops the ablation process after determining that the protective material 206 in the selected region has been removed substantially entirely. But the operator may not know exactly when the protective material 206 has been removed entirely, and may continue the ablation process, removing a portion of the passivation layer 205. If the passivation layer 205 is sufficiently thick, it provides a "backer" that allows the operator to ensure removal of all of the protective material 206 by "drilling" slightly below the bottom of that layer.

For example, if a laser is used for ablation as described above, in a region where laser pulses are applied after the protective material 206 is ablated substantially entirely, the pulses may begin to ablate the underlying passivation layer 205. If the passivation-layer material is absorptive to the laser, the amount of the passivation-layer material removed in each pulse can be less than the amount of protective material removed in each pulse. Therefore, the passivation layer 205 may be able to tolerate several laser pulses without being completely removed (and exposing the underlying elements). The required thickness of the passivation layer can be determined based on the inherent properties of the laser, the protective material, and the passivation-layer material.

In the process described above, the surface of the passivation layer facing the opening in the protective layer may become uneven because in different sub-regions of the region selected to form a window, the ablation device may remove different amounts of the passivation layer. The uneven passivation-layer surface may cause scattering of light at the interface between the uneven surface and air. The scattering can be substantially eliminated or decreased by filling the window with a material having an optical index matching (i.e., substantially the same as) that of the passivation layer. The window can be filled with the index-matching material either before or after receiving an optical device to be mated with the package.

An optical system according to the present invention can include a package and an optical device. In such a system, the optical device can be aligned and optically connected to an optical component in the package. An embodiment of such a system is illustrated in FIGS. 3A-3C; like features are identified with the same reference numerals in each of FIGS. 3A-3C.

Figure 3A:
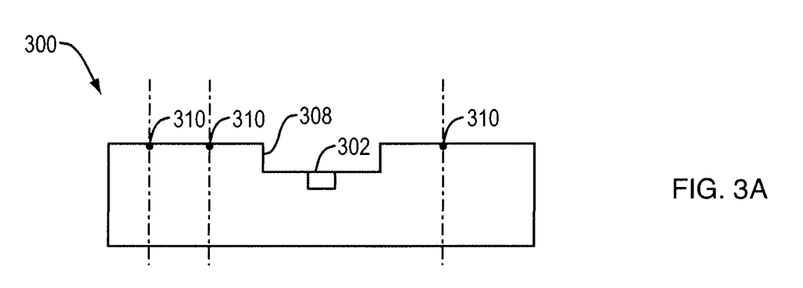
FIGS. 3A-3C show cross-sectional views of an optical package and mating of an optical device with the package.
Figure 3B:
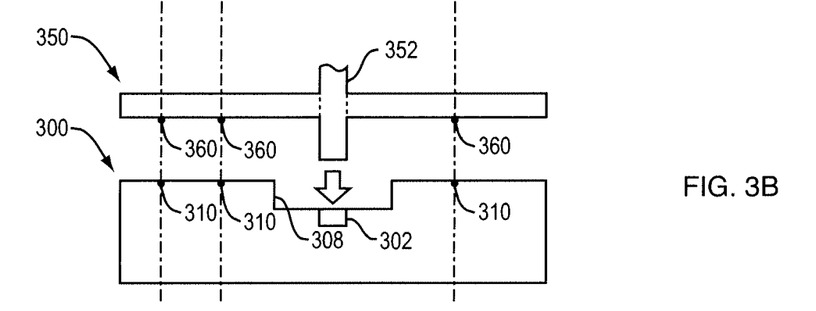
Figure 3C:
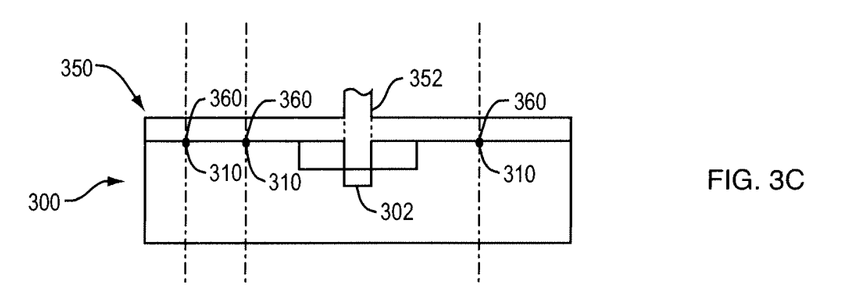

In FIG. 3A, a package 300 contains a well 308, an optical component 302, and alignment features 310 (shown schematically). FIG. 3B shows an optical device 350 which includes an optical fiber 352. Optical device 350 also contains alignment features 360 complementary to the alignment features 350 of package 300. As shown in FIG. 3C, the alignment features 360 of the optical device 350 align and mate with the corresponding alignment features 350 of package 300. Moreover, even though the optical component 302 is not positioned at the center of well 308, the optical fiber 352 is also aligned with and optically connected to optical component 302 in package 300.

Figure 4A:
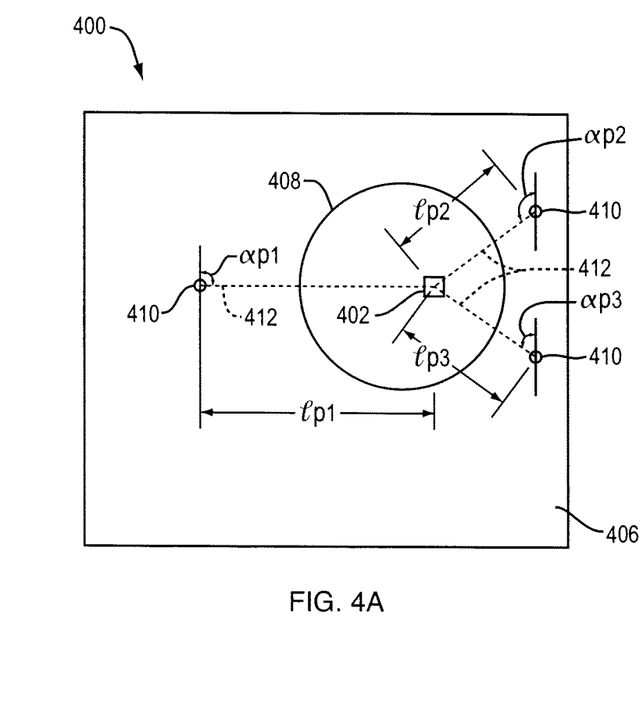
FIGS. 4A and 4B show plan views of a package and an optical device, respectively.

The use of alignment features is described in detail with reference to FIGS. 4A and 4B. An optical component 402 is visible through a window 408 formed in the protective material 406. It can be seen that the optical component 402 is not located at the center of window 408. FIG. 4A shows three alignment holes 410, as an example of alignment features. The alignment features can also be, for example, pins, bumps, dents, grooves, and/or edges. The positioning of each alignment hole 410 with respect to the optical component 402 is given by a series of segments 412, which extends from the alignment hole 410 to the optical component 402. Segments 412 have lengths lp1, lp2, lp3, and are oriented at angles $\alpha p1$, $\alpha p2$, $\alpha p3$ with respect to a reference axis A. The segments 412 in relation to the reference axis A identify the location of the optical component 402, and determine whether or not it is at the center of window 408 (or even within the window 408). It should be understood that although FIG. 4A shows three alignment holes and the corresponding three segments, this is for illustrative purposes only, and packages comprising fewer (e.g., as few as one) or more alignment features are within the scope of the invention.

Figure 4B:
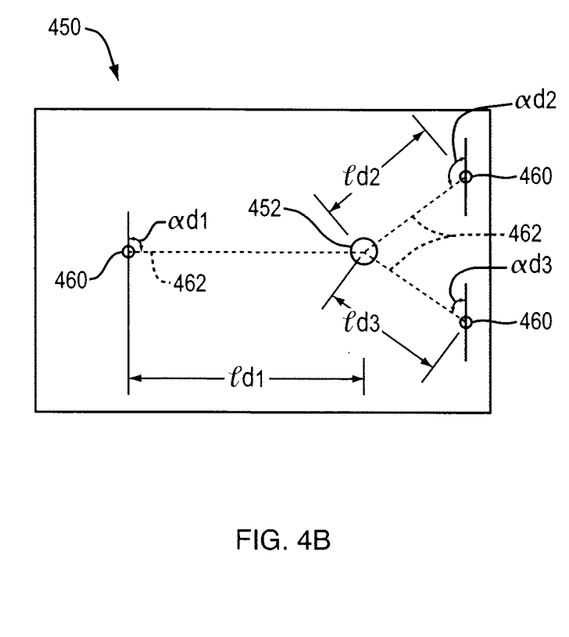

As shown in FIG. 4B, an optical device 450 includes an optical fiber 452 intended to be aligned with and connected to the optical component 402 in package 400. The optical device 450 has secondary alignment features 460 complementary to the alignment features 410 of package 400. Segments 462, having lengths ld1, ld2, ld3, and angles $\alpha d1$, $\alpha d2$, $\alpha d3$ with respect to reference axis A are associated with the secondary alignment features 460 and the optical fiber 452. For each secondary alignment feature 460, if the length and angle of a segment 462 associated with that feature are substantially the same as the length and angle of the segment 412 associated with the corresponding alignment feature, the location of the optical fiber 452 relative to secondary alignment features 460 is substantially the same as the location of optical device 402 relative to alignment features 410. Thus, when the corresponding alignment features are mated, the optical fiber 452 in optical device 450 will be aligned and connected with the optical component 402 in package 400, whether or not the optical component 402 is at the center of window 408.

Figure 5:
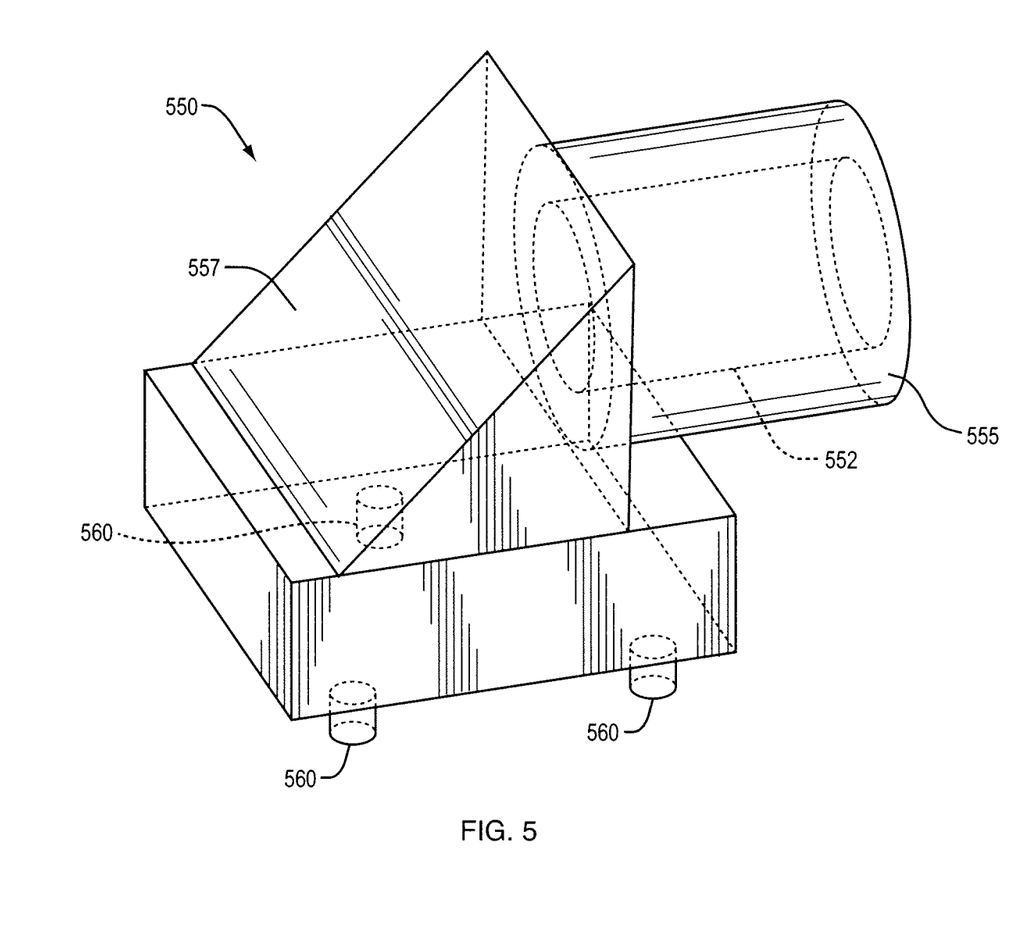
FIG. 5 shows an optical device including a prism.
Figure 6:
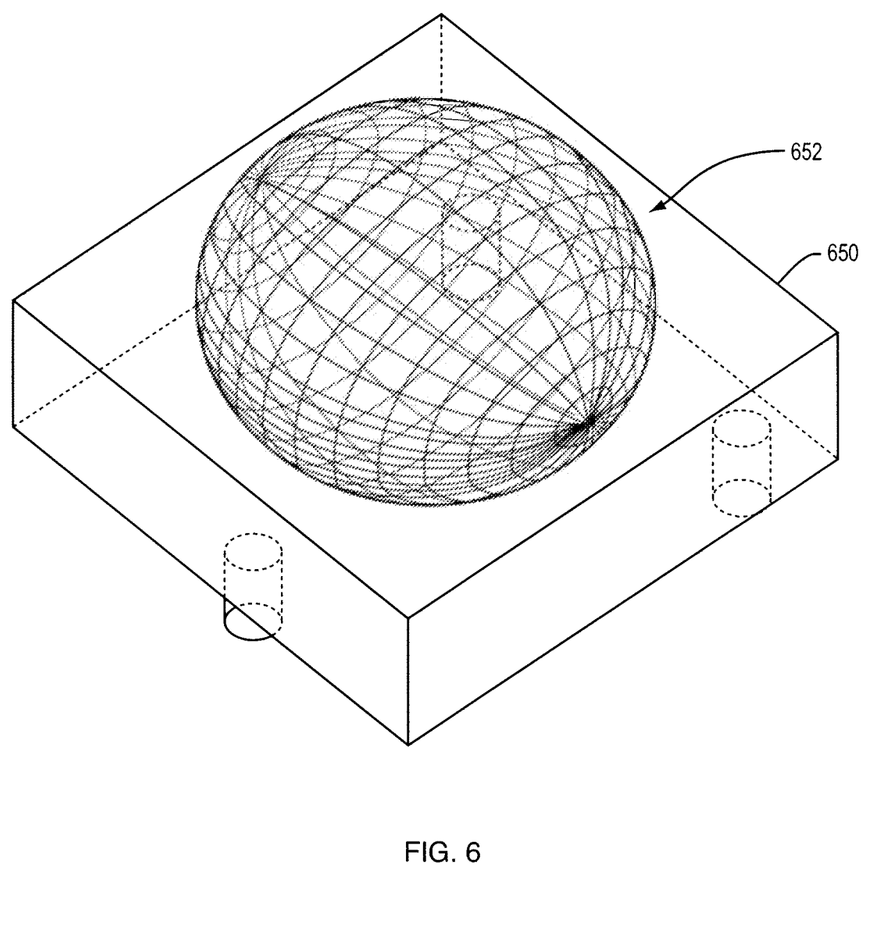
FIG. 6 shows an optical device including a lens.

An optical device to be mated with an optical package can include various types of optical components and combinations thereof. For example, FIG. 5 shows an optical device 550 which includes an optical fiber 552 in a fiber holder 555. The optical fiber 552 is held in contact with a prism 557, which can optically connect with optical components in packages with which the optical device 550 is designed to mate. Alignment pins 560 are the secondary alignment features of optical device 550, and are complementary to alignment holes in a package (not shown). In FIG. 6, an optical device 650 includes a lens 652 which optically connects with a component in a package in a similar fashion.

Figure 7:
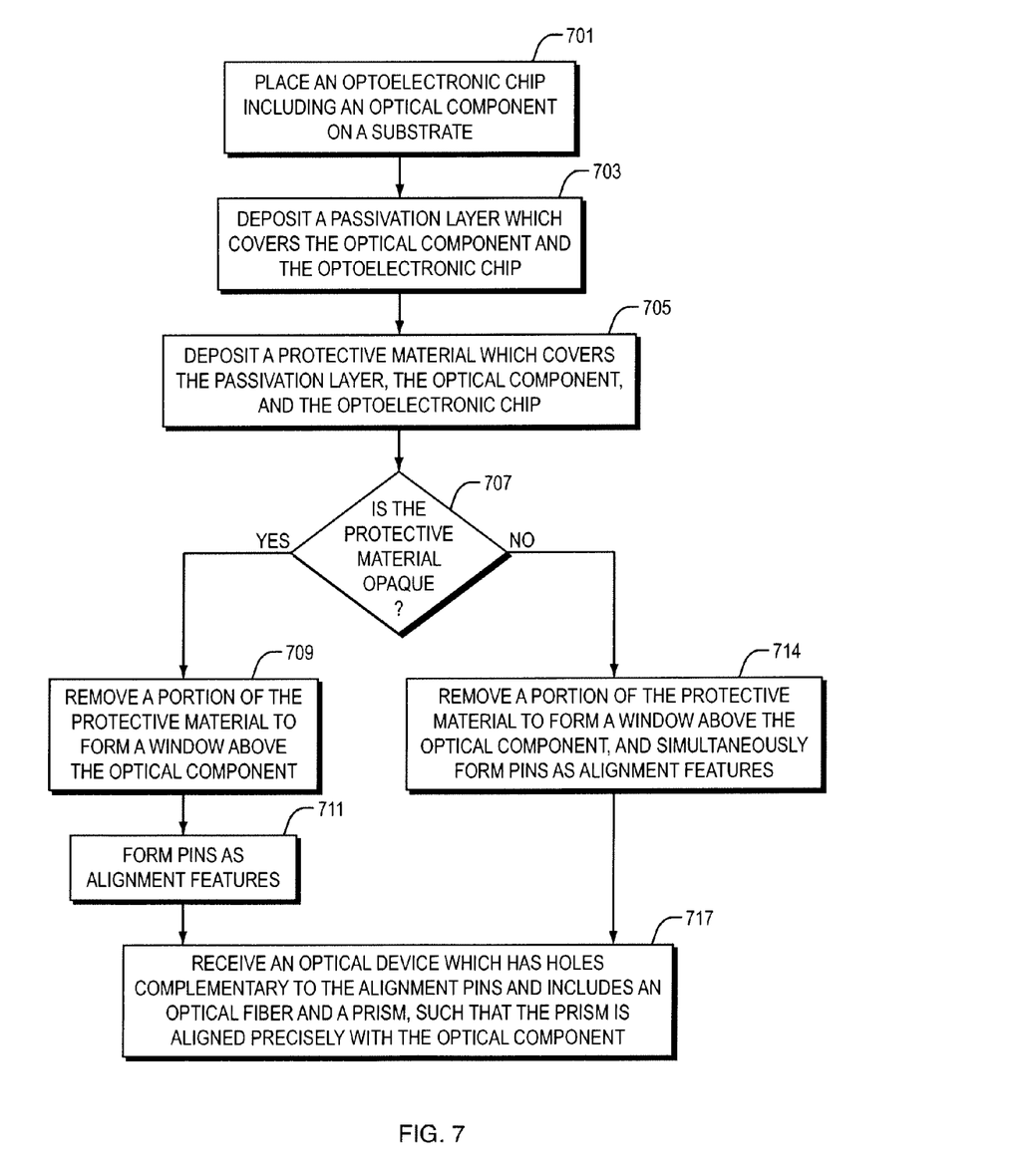
FIG. 7 shows an exemplary sequence of steps for forming an aligned package in accordance with the invention.

A representative sequence of steps for optically connecting components in accordance herewith are described with reference to FIG. 7. In step 701, an optoelectronic chip including an optical component is mounted on a substrate. A passivation layer covering both the chip and the component is deposited over the chip in step 703. The transparent passivation layer allows light to pass through and to form an optical connection with the optical component. In step 705, a protective material is deposited over the passivation layer, the optoelectronic chip, and the optical component.

If the protective material is opaque (e.g. a black epoxy), as determined in step 707, a portion of the material is removed first, in step 709, to form a window above the optical component. For example, the protective material can be removed using a UV laser as described above. While forming a window, a portion of the passivation layer may also be removed but at least some portion of the passivation layer is preserved over the optical component. Then, pins are formed in the protective layer as alignment features in step 711.

The alignment pins can be formed by a process similar to the process of forming a window in the protective material, as described above. In forming a window, the protective material is removed substantially entirely from a selected region. An alignment hole can be formed similarly, although only a portion of the protective material in the selected region is typically removed. Alignment features such as dents and grooves can be formed in a similar manner. An alignment pin, on the other hand, can be formed by removing the entire area of the protective material other than the pins to a depth corresponding to the desired pin height. Alignment features such as bumps and edges can be formed similarly.

In some instances, it is possible that the secondary alignment features are created in a mating optical device before creating the complementary alignment features in the package. In that event, the locations of the alignment features in the package relative to the optical component must be determined such that the optical components in the package and the device will be substantially aligned when the package and the device are mated. A visual inspection of the optical component in the package can guide determining the locations of the alignment features, but such inspection is not possible if the protective material deposited over the optical component (or a passivation layer) is opaque. After a window is formed in step 709, however, the optical component becomes visible. Then, the locations of the alignment pins can be determined and the pins can be formed, as described above, in step 711.

If the protective layer is transparent, it is removed to form a window, as described above, and the alignment pins are formed simultaneously in step 714 because the optical component is visible prior to removal of the protective layer, and hence, the locations of the pins can be determined without having to form a window first. Specifically, when an ablation device removes the protective material to form a window, it can also partially remove protective material from regions other than those selected for creating the alignment pins. It should be understood, however, that even when transparent protective material is deposited in step 705, the steps of forming a window and forming the alignment features can be performed sequentially. Similarly, if opaque protective material is deposited in step 705, but complementary alignment features of the optical device to be mated with the package are formed after forming the alignment features in the packages, the locations of the features in the package can be determined by estimating the location of the optical component in the chip. Therefore, the alignment features in the package and the window can be formed simultaneously.

Finally, in step 717, an optical device having holes as complementary alignment features and an optical fiber connected through a prism is received such that the prism is aligned and connected with the optical component in the package. The light passing through the prism will be aligned with and optically connected to the optical fiber.

While the invention has been particularly shown and described with reference to specific embodiments, it will be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are therefore intended to be embraced.

What is claimed is:

1. A method of fabricating a device, the method comprising the steps of:
   on a circuit comprising (i) an optical component and (ii) a protective material deposited over and adhered to the circuit and the optical component, removing a portion of the protective material so as to form a window above the optical component so as to expose the optical component; and
   based on a location of the optical component on the circuit, forming alignment features in the protective material at locations relative to the optical component.

2. The method of claim 1, wherein the protective material is opaque.

3. The method of claim 1, wherein the alignment features are holes.

4. The method of claim 1, wherein a laser is used to remove the protective material above the optical component so as to form a window thereover, and to form the alignment features.

5. The method of claim 1, wherein the alignment features are formed substantially simultaneously with removing the protective material above the optical component.

6. The method of claim 1, wherein locations of the alignment features are determined, and the alignment features are formed after removing the protective material above the optical component.

7. The method of claim 1, wherein the protective material that is removed has an area that exceeds an area of the optical component so that, notwithstanding offset of the laser relative to the optical component, the optical component is fully exposed.

8. The method of claim 1, further comprising receiving through an area from which the protective material is removed an optical device, and optically connecting the optical device to the optical component.

9. The method of claim 1, further comprising positioning an optical device over the circuit by mating, with the alignment features, complementary features on the optical device.

10. The method of claim 9, further comprising optically connecting the optical device to the optical component.

11. The method of claim 9, wherein the protective material comprises epoxy.

12. A method of fabricating a device, the method comprising the steps of:
    on a circuit comprising (i) an optical component and (ii) a protective material over the circuit and the optical component, removing a portion of the protective material so as to form a window above the optical component so as to expose the optical component; and
    based on a location of the optical component on the circuit, forming alignment features in the protective material at locations relative to the optical component,
    wherein a passivation layer separates the optical component from the protective material, the laser removing the protective material until the passivation layer is reached.

13. A package configured to receive an aligned optical device thereon, the package comprising:
    an optical component disposed on a substrate;
    a protective material deposited over and adhered to the substrate but having a window formed therein, the window exposing the optical component; and
    alignment features formed in the protective material at locations spaced apart from the optical component and configured to receive complementary features of an optical device.

14. The package of claim 13, further comprising electrical pins at the top of the package for electrical connection.

15. The package of claim 13, wherein the alignment features formed in the protective material comprise holes.

16. The package of claim 13, wherein the alignment features formed in the protective material comprise pins.

17. The package of claim 13, wherein the protective material comprises epoxy.

18. A package configured to receive an aligned optical device thereon, the package comprising:
    an optical component disposed on a substrate;
    a protective material over the substrate but having a window exposing the optical component; and
    alignment features formed in the protective material at locations spaced apart from the optical component and configured to receive complementary features of an optical device; and
    a passivation layer disposed over the substrate but below the protective material.

19. An optical system comprising:
    an optical component disposed on a substrate;
    a protective material deposited over and adhered to the substrate but having a window formed therein, the window exposing the optical component;
    first alignment features formed in the protective material at locations spaced apart from the optical component; and
    an optical device comprising secondary alignment features complementary to the first alignment features, wherein the secondary alignment features are received by the first alignment features and mated therewith, such that the optical device is aligned with the optical component.

20. The optical system of claim 19, wherein the optical device includes an optical fiber.

21. The optical system of claim 20, wherein the optical fiber directly connects to the optical component through the window in the protective material.

22. The optical system of claim 21, wherein the window in the protective material is at least partially filled with an index-matching fluid to reduce scattering of light at the connection between the optical fiber and the optical device.

23. The optical system of claim 19, wherein the optical device includes a prism and an optical fiber connecting to the optical component through the prism.

24. The optical system of claim 19, wherein the optical device includes a lens.

25. The optical system of claim 19, wherein the first alignment features are holes, and wherein the secondary alignment features are pins.

26. The optical system of claim 19, wherein the first alignment features are pins, and wherein the secondary alignment features are holes.

27. The optical system of claim 19, wherein the protective material comprises epoxy.

28. An optical system comprising:
   an optical component disposed on a substrate;
   a protective material over the substrate but having a window exposing the optical component;
   first alignment features formed in the protective material at locations spaced apart from the optical component;
   an optical device comprising secondary alignment features complementary to the first alignment features, wherein the secondary alignment features are received by the first alignment features and mated therewith, such that the optical device is aligned with the optical component; and
   a passivation layer disposed over the substrate but below the protective material.

* * * * *